United States Patent
Wang et al.

(10) Patent No.: US 12,380,934 B2
(45) Date of Patent: Aug. 5, 2025

(54) PARAMETERIZED REGISTER PROGRAMMING PROTOCOL (RPP) TO SAVE LAYOUT ROUTING AREA

(71) Applicant: InvenSense, Inc., San Jose, CA (US)

(72) Inventors: Hou-Yi Wang, Cupertino, CA (US); Biswajit Datta, Fremont, CA (US); Sarvesh Shrivastava, Sunnyvale, CA (US)

(73) Assignee: InvenSense, Inc., San Jose, CA (US)

( * ) Notice: Subject to any disclaimer, the term of this patent is extended or adjusted under 35 U.S.C. 154(b) by 656 days.

(21) Appl. No.: 17/843,831

(22) Filed: Jun. 17, 2022

(65) Prior Publication Data

US 2023/0410860 A1     Dec. 21, 2023

(51) Int. Cl.
   *G11C 7/24*     (2006.01)
   *G11C 7/10*     (2006.01)
   *G11C 7/22*     (2006.01)

(52) U.S. Cl.
   CPC .......... *G11C 7/1096* (2013.01); *G11C 7/1039* (2013.01); *G11C 7/1048* (2013.01); *G11C 7/1069* (2013.01); *G11C 7/222* (2013.01); *G11C 7/24* (2013.01)

(58) Field of Classification Search
   USPC .................................. 716/116, 117, 118, 126
   See application file for complete search history.

(56) References Cited

U.S. PATENT DOCUMENTS

| | | | |
|---|---|---|---|
| 2014/0281724 A1* | 9/2014 | Ki ........................ | G06F 11/3636 714/37 |
| 2018/0095661 A1* | 4/2018 | Ananthanarayanan ...................... | G06F 3/064 |
| 2022/0050798 A1* | 2/2022 | Shahramian ............ | G06F 13/36 |

\* cited by examiner

*Primary Examiner* — Brian Ngo
(74) *Attorney, Agent, or Firm* — DLA Piper LLP (US)

(57) ABSTRACT

A parameterized register interface of an integrated circuit and methods of register programming. An integrated circuit includes a digital controller, at least one client comprising at least one programmable register and a parameterized bus coupled to the digital controller and the client. The digital controller is configured to: transfer, via the parameterized bus, address data and/or register data between the digital controller and the client according to one or more interface signals conveyed over the parameterized bus; generate a transaction command comprising at least one transaction specific to the programmable register of the client, the transaction command generated according to a predetermined register programming protocol; and transfer, via the parameterized bus, the transaction command together with at least one predetermined combination of the interface signals to the client. The programmable register is configured to perform the transaction in accordance with the transaction command.

28 Claims, 11 Drawing Sheets

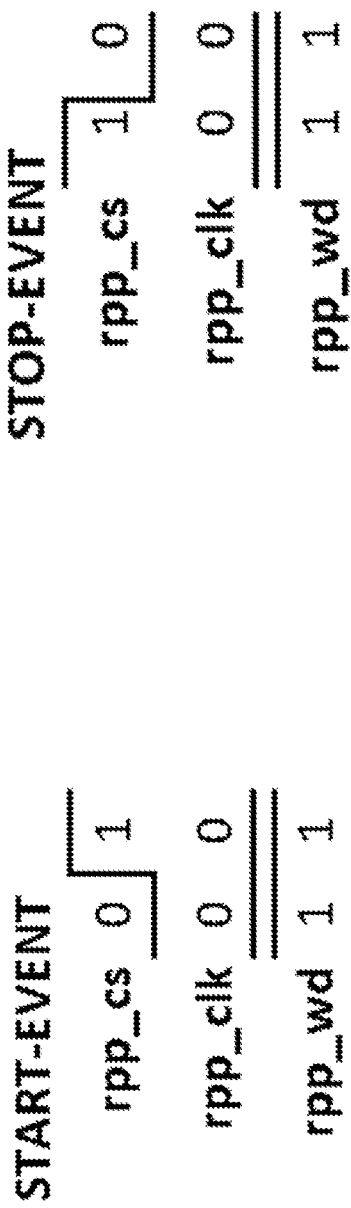

| OPERATION | SEQUENCES |
|---|---|
| Write-op1 | IDLE → START → CMD → ID → ADDR1 → wDATA1 → ADDR2 → wDATA2 → ... → STOP → IDLE |
| Write-op2 | IDLE → START → CMD → ID → ADDR1 → wData1 → wDATA2 → wDATA3 → ... → STOP → IDLE |
| Write-op3 | IDLE --> START → CMD → ID → ADDR1 → Mask1 → wDATA1 → ADDR2 → Mask2 → wDATA2 → ... → STOP → IDLE |
| Write-op4 | IDLE --> START → CMD → ID → ADDR1 → Mask1 → wDATA1 → Mask2 → wDATA2 → ... → STOP → IDLE |
| Read-op1 | IDLE --> START → CMD → ID → ADDR1 → rDATA1 → ADDR2 → rDATA2 → ... → STOP → IDLE |
| Read-op2 | IDLE → START → CMD → ID → ADDR1 → rDATA1 → rDATA2 → rDATA3 → ... → STOP → IDLE |
| Clear-op | IDLE --> START → CMD → ID → ADDR1 → Mask1 → ADDR2 → Mask2 → ... → STOP → IDLE |
| Cmd-op | IDLE → START → CMD → STOP → IDLE |

FIG. 6

PARAMETERIZED REGISTER PROGRAMMING PROTOCOL (RPP) TO SAVE LAYOUT ROUTING AREA

FIELD

The present disclosure generally relates to register interfaces of an integrated circuit and, in particular, to a parameterized register interface having a parameterized register programming protocol configured to conserve a layout routing area of an integrated circuit.

BACKGROUND

An integrated circuit (IC) may have a number of digital blocks (e.g., clients), which digital blocks may be associated with one or more analog IP components. The digital blocks may include one or more programmable registers storing data that may be utilized in one or more inter-block operations. Conventional IC chips typically utilize one of the following bus architecture techniques to enable the IC chip to access and control inter-block operations. A first technique is to utilize a parallel bus between the digital components and the analog components. However, the parallel bus typically incurs a larger area cost due to routing of analog and digital channels. A second technique is to utilize a serial bus between the digital components and the analog components, with the support of additional side-band signals (on additional routing channels) for inter-block operations. This second technique, however, may not provide a minimum routing area due to the additional routing channels utilized for the side-band signals. A third conventional technique may utilize a combination of the first and second techniques (e.g., a parallel bus and additional side-band signals) between the digital and analog components. However, this third technique is still unable to achieve a minimum overall routing area cost.

Accordingly, there is a need for improved register interfaces to reduce an area cost related to inter-block transaction operations.

SUMMARY

Aspects of the present disclosure relate to a parameterized register interface of an integrated circuit having a register programming protocol to save (e.g., conserve) layout routing area and enable various register accessing schemes (e.g., read-write, read-only, write-clear, read-clear, password-protection, error-protection, etc.) with minimal area cost on register implementation.

In some embodiments, an integrated circuit is disclosed comprising: a digital controller; at least one client comprising at least one programmable register; and a parameterized bus coupled to the digital controller and the at least one client. The digital controller is configured to transfer, via the parameterized bus, at least one of address data and register data between the digital controller and the at least one client according to one or more interface signals conveyed over the parameterized bus. In some embodiments, the digital controller is configured to generate a transaction command comprising at least one transaction specific to the at least one programmable register of the at least one client. The transaction command is generated according to a predetermined register programming protocol (RPP). In some embodiments, the digital controller is configured to transfer, via the parameterized bus, the transaction command together with at least one predetermined combination of the one or more interface signals to the at least one client. In some embodiments, the at least one programmable register is configured to perform the at least one transaction in accordance with the transaction command.

In some embodiments, the at least one transaction comprises at least one of a read operation, a write operation, a read-only operation, a write-clear operation, a read-clear operation, a password protection operation and an error-protection operation. In some embodiments, the digital controller may be configured to operate with one or more addressing modes including at least one of burst access with an address auto-increment mode and burst access with a non-consecutive address mode.

In some embodiments, the one or more interface signals comprise at least one of a clock signal, a write data signal, a read data signal and a event control signal. In some embodiments, the at least one predetermined combination of the one or more interface signals forms one or more bus conditions, the one or more bus conditions comprising one or more of a reset condition, an idle condition, a start transaction condition, a stop transaction condition and an active condition. Additionally, in some embodiments, the digital controller is configured to transfer the transaction command such that at least one of the one or more bus conditions and the transaction command are arranged in a predetermined sequence. Additionally, in some embodiments, the predetermined sequence comprises a sequential order of the idle condition, the start transaction condition, the transaction command, the stop transaction condition and the idle condition.

In some embodiments, the transaction command comprises a transaction mode component, a client identifier component, at least one register address component, and at least one data operation component, the at least one data operation component indicative of at least one of a read operation and a write operation. Additionally, in some embodiments, the transaction command further comprises one or more of a mask component and a status bit indicative of a corruption status of non-volatile memory data.

In some embodiments, the parameterized bus is associated with one or more parameters, the one or more parameters comprising one or more of a client select line, a client identifier bus width, an address bus logical width, a data bus logical width, an address bus physical width, a write data bus physical width, a read data bus width, a staging buffer type, a final register type, an indication that an address bus and a write bus share physical wires, an indication that a read data bus comprises a daisy chain formation, an indication of a wired OR implementation external to the at least one client, and an indication of a masking implementation.

In some embodiments, the digital controller is configured to encode the transaction command in a same set of serial bus lines of the parameterized bus used to transfer the at least one of the address data and the register data between the digital controller and the at least one client. In some embodiments, the parameterized bus is configurable between serial interfacing and parallel interfacing. In some embodiments, the parameterized bus is configured to comprise one or more of a scalable bus width, a scalable client identifier bus, a scalable address bus and a scalable data bus.

In some embodiments, the at least one programmable register comprises at least one of a flop-based storage component and a latch-based storage component. In some embodiments, the parameterized bus comprises a first set of parameterized bus lines from the digital controller to the at least one client and a second set of parameterized bus lines from the at least one client to the digital controller.

In another aspect, a method of operation of an integrated circuit is disclosed. In one embodiment, a method of operation of an integrated circuit is provided, comprising: transferring, by a digital controller, via a parameterized bus coupled to the digital controller and at least one client, at least one of address data and register data between the digital controller and the at least one client according to one or more interface signals conveyed over the parameterized bus, the at least one client comprising at least one programmable register; generating, by the digital controller, a transaction command comprising at least one transaction specific to the at least one programmable register of the at least one client, the transaction command generated according to a predetermined register programming protocol (RPP); transferring, by the digital controller, via the parameterized bus, the transaction command together with at least one predetermined combination of the one or more interface signals to the at least one client; and performing, by the at least one programmable register, the at least one transaction in accordance with the transaction command.

In some embodiments, the at least one transaction comprises at least one of a read operation, a write operation, a read-only operation, a write-clear operation, a read-clear operation, a password protection operation and an error-protection operation. In some embodiments, the method may further comprise transferring one or more of the at least one of the address data, the register data and the transaction command in accordance with one or more addressing modes including at least one of burst access with an address auto-increment mode and burst access with a non-consecutive address mode.

In some embodiments, the one or more interface signals comprise at least one of a clock signal, a write data signal, a read data signal and a event control signal. In some embodiments, the at least one predetermined combination of the one or more interface signals forms one or more bus conditions, the one or more bus conditions comprising one or more of a reset condition, an idle condition, a start transaction condition, a stop transaction condition and an active condition. Additionally, in some embodiments, the transferring of the transaction command may further comprise transferring the transaction command together with the at least one predetermined combination of the one or more interface signals such that at least one of the one or more bus conditions and the transaction command are arranged in a predetermined sequence. Additionally, in some embodiments, the predetermined sequence comprises a sequential order of the idle condition, the start transaction condition, the transaction command, the stop transaction condition and the idle condition.

In some embodiments, the transaction command comprises a transaction mode component, a client identifier component, at least one register address component, and at least one data operation component, the at least one data operation component indicative of at least one of a read operation and a write operation. Additionally, in some embodiments, the transaction command further comprises one or more of a mask component and a status bit indicative of a corruption status of non-volatile memory data.

In some embodiments, the parameterized bus is associated with one or more parameters, the one or more parameters comprising one or more of a client select line, a client identifier bus width, an address bus logical width, a data bus logical width, an address bus physical width, a write data bus physical width, a read data bus width, a staging buffer type, a final register type, an indication that an address bus and a write bus share physical wires, an indication that a read data bus comprises a daisy chain formation, an indication of a wired OR implementation external to the at least one client and an indication of a masking implementation.

In some embodiments, the method may further comprise encoding, by the digital controller, the transaction command in a same set of serial bus lines of the parameterized bus used to transfer the at least one of the address data and the register data between the digital controller and the at least one client. In some embodiments, the method may further comprise configuring the parameterized bus between serial interfacing and parallel interfacing. In some embodiments, the method may further comprise scaling, by the parameterized bus, one or more of a bus width, a client identifier bus, an address bus and a data bus.

BRIEF DESCRIPTION OF THE DRAWINGS

Examples of a parameterized register interface of an integrated circuit and a register programming protocol (RPP) are shown in the accompanying drawings.

FIGS. 5A and 5B are example timing diagrams illustrating respective start-event and stop-event bus conditions, according to an aspect of the present disclosure.

FIG. 6 is an example chart illustrating various RPP sequences associated with different transaction operations, according to an aspect of the present disclosure.

DETAILED DESCRIPTION

Figure 1:
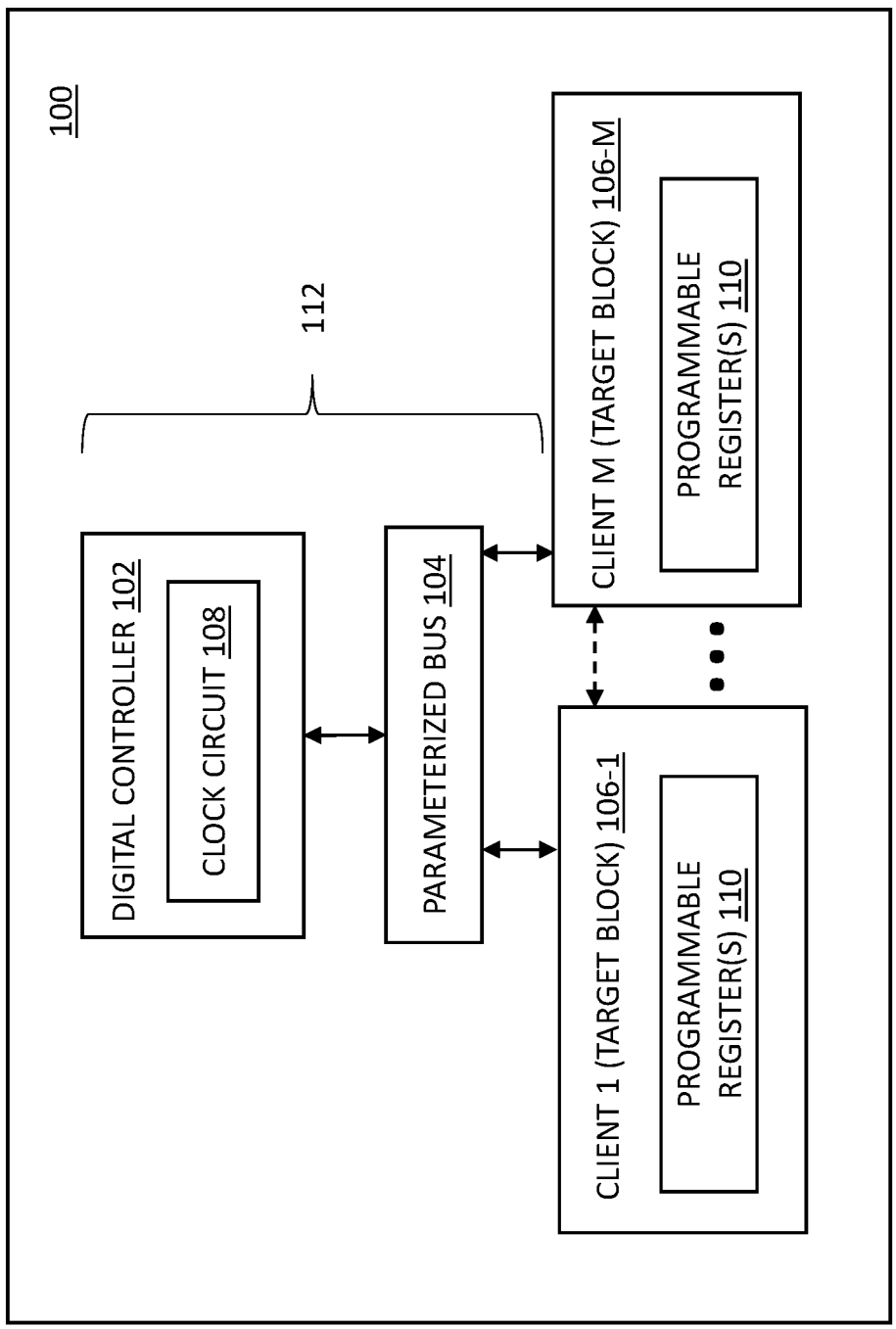
FIG. 1 is a functional block diagram of an example integrated circuit having a parameterized register interface, according to an aspect of the present disclosure.

Aspects of the present disclosure will now be described more fully hereinafter with reference to the accompanying drawings in which example embodiments are shown. In the following description, for purposes of explanation, numerous specific details are set forth in or der to provide a through understanding of the various embodiments. However, the present disclosure may be embodied in many different forms and should not be construed as limited to the example embodiments set forth herein.

As mentioned above, conventional IC chips utilize register interface architecture techniques are unable to minimize routing area cost, due to the routing of digital and analog channels, as well as the use of side-band signals, in some cases. In contrast, the present disclosure are directed to parameterized register interfaces having a register programming protocol (RPP) that is able to conserve layout routing area(s), while enabling various register accessing schemes (e.g., read-write, read-only, write-clear, read-clear, password-protection, error-protection and the like). The RPP of the present disclosure is able to provide various register accessing schemes while providing a minimal areal cost on register implementation.

The parameterized register interface of the present disclosure may include a digital controller and a parameterized bus, and may be configured to encode transaction commands into the same serial lines of the parameterized bus used to pass register address and register data from the controller to one or more target clients (e.g., block(s)). The encoding of transaction lines into the same serial lines removes any need for additional side-band signals to facilitate inter-block transactions. In addition, the encoding patterns themselves (via a sequence of bus conditions and transaction commands, as described further below) ensures a signal timing among the lines of the parameterized bus carrying out the transaction operation. In addition, the parameterized register interface is able to operate with minimal and/or no A/C timing dependence.

The RPP of the present disclosure may provide a configurable interfacing technique (between the digital controller and blocks containing programmable registers) to support different implementation needs. The parameterized register interface of the present disclosure may provide a number of benefits, including: the ability to perform inter-block transactions, a configurability between serial interfacing and parallel interfacing, a reduction in routing area cost for the interface signals (transferred between the digital controller and blocks via the parameterized bus), a reduction in area cost to an area of the block(s) having one or more programmable registers and a configurable latency cost for accessing (e.g., reading from, writing to) programmable register(s), as latency may vary for different configurations.

In some embodiments, the parameterized register interface may enable a scalable client (block) ID bus width, a scalable address bus width and a scalable data bus width. The parametrized register interface may also provide flexible physical wire connections. This flexibility may enable flexible trade-off selections between a routing area cost and a register access latency cost. This flexibility may also enable configurable (i.e., parameterized) bus width from the digital controller to the client(s), and configurable (parameterized) bus width from client(s) back to the digital controller.

In some embodiments, the parameterized register interface may support different addressing schemes between each transaction. For example, the interface may support burst access to target clients with address auto-increment capability. As another example, the interface may support burst access to target client with a non-consecutive address scheme.

In some embodiments, the parameterized register interface having the RPP may be configured to minimize an area (e.g., a routing area and/or a temporary storage area for facilitating register access transactions) on the clients. As part of minimization of area, the interface may be configured to support both flop-based or latch-based storage element implementation choices in the clients, and may be configured to executes the access operations (e.g., write-clear, read-clear, password-protection operations, etc.) without incurring an additional area cost to the clients.

The parameterized register interface having the RPP (described further below) solves several technical problems. For example, the interface of the present disclosure may reduce an area cost for inter-block transactions among clients (blocks). As another, example, with the parameterized register interface, the number of clients (blocks) involved may include two or more clients in a same transaction. In addition, the parameterized register interface may be configured to reduce and/or remove any side-band signals for facilitating inter-block transaction operations. As yet another example, the parameterized register interface may be configured to reduce an area cost of executing additional programming functions to the client(s) (block(s)) where the programmable registers reside.

Figure 2:
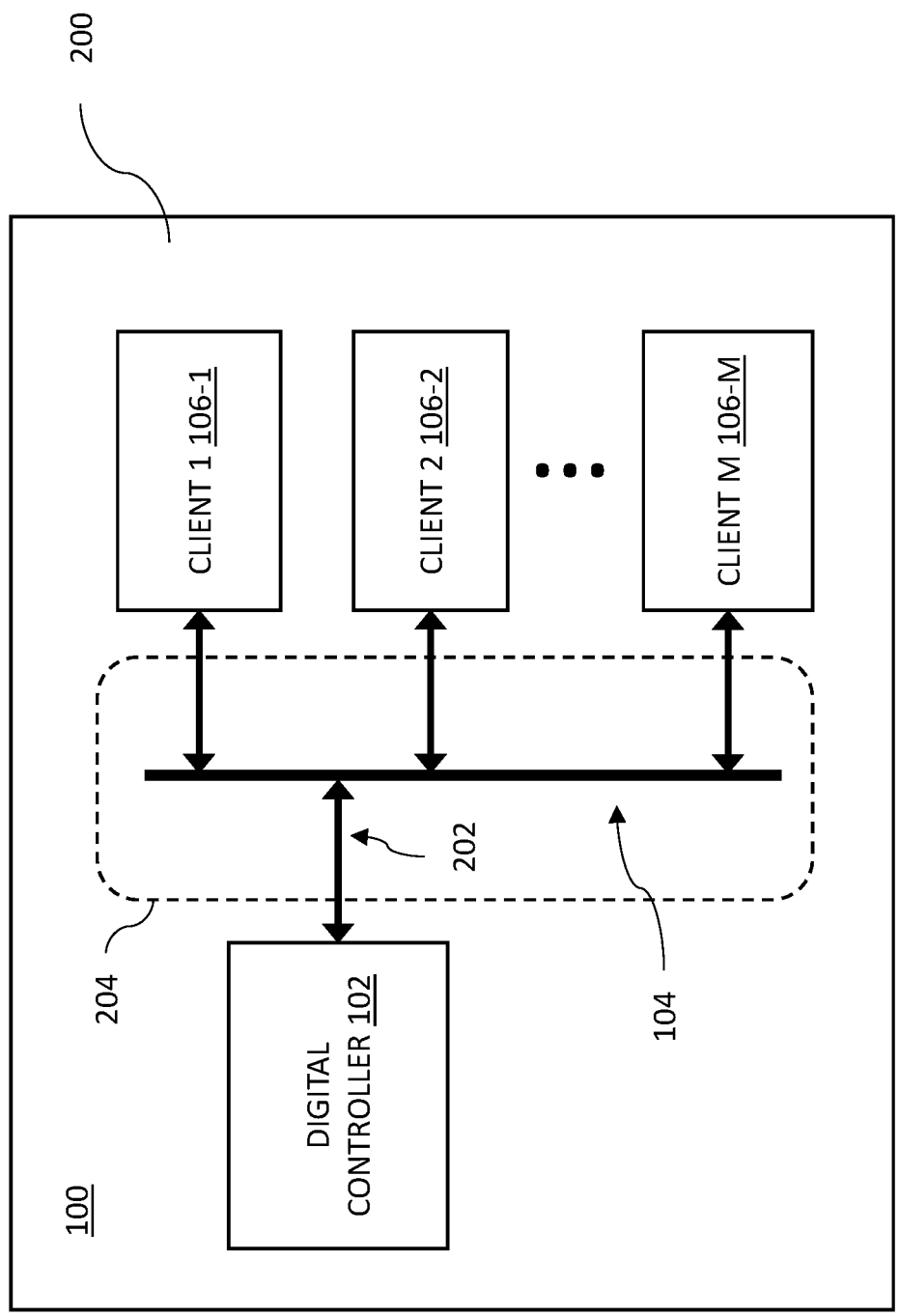
FIG. 2 is an overhead view diagram of the example integrated circuit shown in FIG. 1, according to an aspect of the present disclosure.
Figure 3:
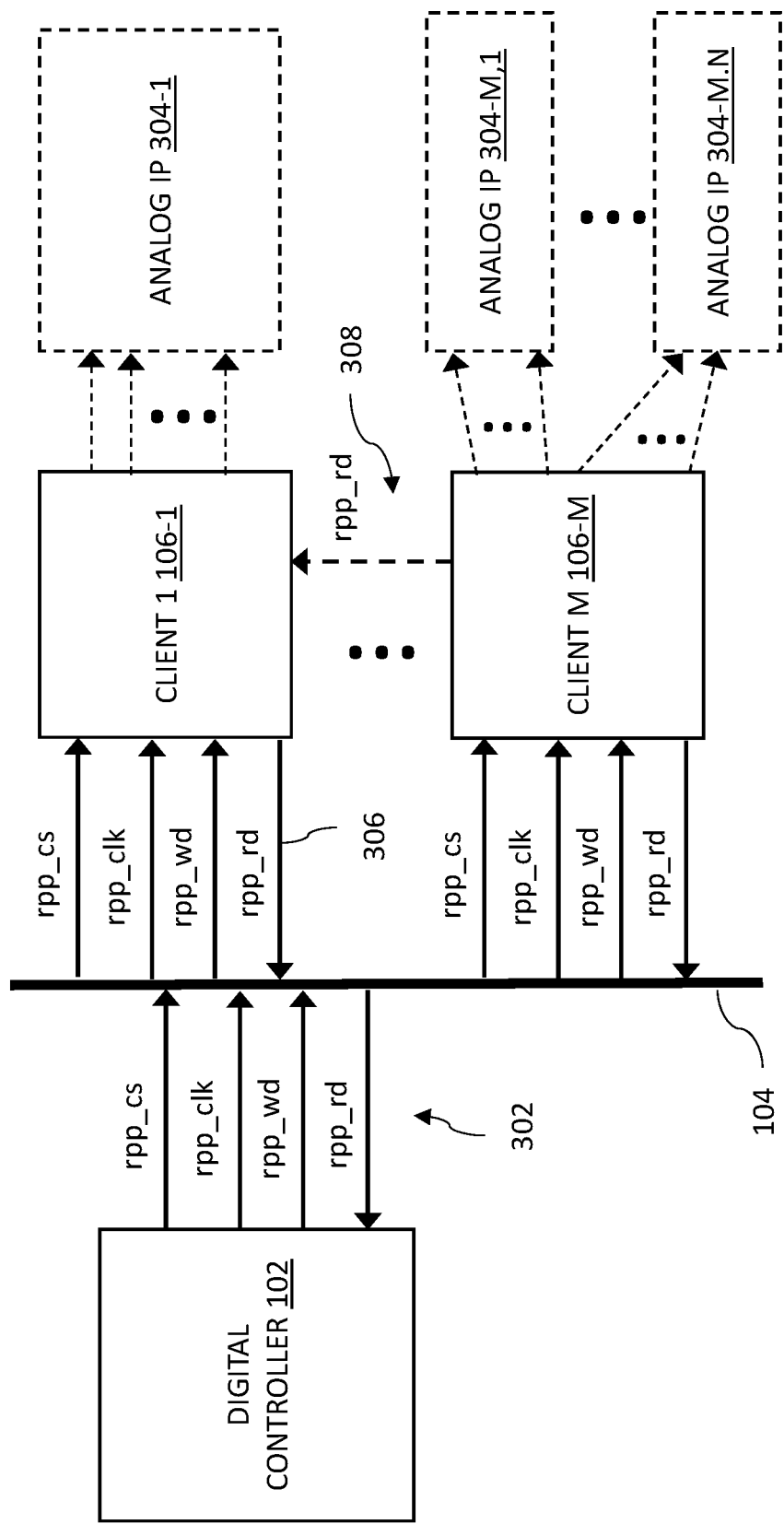
FIG. 3 is a functional block diagram of the parameterized register interface shown in FIG. 1, according to an aspect of the present disclosure.

Referring next to FIGS. 1-3, an example integrated circuit (IC) 100 having parameterized register interface (PRI) 112 is described. In particular, FIG. 1 is a functional block diagram of example IC 100 having PRI 112; FIG. 2 is an overhead view diagram of IC 100; and FIG. 3 is a functional block diagram of PRI 112 illustrating various interface signals 302.

As shown in FIG. 1, IC 100 may include digital controller 102, parameterized bus 104 and one or more clients (e.g., target block(s)), designated generally as client(s) 106. For example, client(s) 106 may include client 106-1 (e.g., Client 1), . . . , client 106-M (e.g., Client M), where M is an integer greater than or equal to 1. Digital controller 102 may be configured to communicate with client(s) 106 via parameterized bus 104. In some examples, two or more clients 106 (e.g., client 106-1 and client 106-M) may be configured for communication therebetween (illustrated by the dashed double-headed arrow) such as via at least one read bus line (e.g., optional read bus line 308 shown in FIG. 3 for transmitting a read interface signal (rpp_rd signal)) directly from one client (e.g., client 106-M) to a another client (e.g., client 106-1). Digital controller 102 and parameterized bus 104 may collectively define PRI 112.

Digital controller 102 may represent a master device on parameterized bus 104, and may be configured to coordinate all activities with client(s) 106 on parameterized bus 104. In some examples, digital controller 102 may be configured to transfer address data and/or register data between digital controller 102 and one or more programmable registers 110 among client(s) 106. In general, digital controller 102 may be configured to generate one or more transaction commands (discussed further below) to perform one or more transactions with programmable register(s) 110. In some examples, digital controller 102 may be configured to initiate one or more operations with client(s) 106 based on one or more instructions from one or more other components of IC 100 (e.g., a central processing unit (CPU) (not shown), a digital signal processor (DSP) (not shown), etc.). In general, a transaction command may indicate a sequence of actions in order to perform one or more transactions (e.g., write, read, clear) with one or more among programmable register(s) 110 of client(s) 106. In some examples, digital controller 102 may be configured to operate with one or more addressing modes including, without being limited to, burst access with an auto-increment mode and burst access with a non-consecutive address mode.

In some examples, digital controller 102 may include a microprocessor and one or more programmable memory components. The memory component(s) may be configured to store programming information that may be utilized by digital controller 102 to generate transaction commands.

In some examples, digital controller 102 may include clock circuit 108. Clock circuit 108 may be configured to generate one or more clock signals. The clock signal(s) may be used to drive all interface signals generated by digital controller 102 that may be transmitted to client(s) 106 via parameterized bus 104.

Parameterized bus 104 may be configured to transfer one or more interface signals 302 (shown in FIG. 3) and transaction commands between digital controller 102 and one or more of client(s) 106. In some examples, parameterized bus 104 may include one or more address bus lines (forming an address bus) and one or more data bus lines (forming a data bus). In some examples, parameterized bus 104 may include one or more client identifier (ID) bus lines (forming a client ID bus). In some examples, parameterized bus 104 may also include one or more control bus lines (forming a control bus). In general, parameterized bus 104 may represent a network having digital controller 102 and at least one target block (i.e., client(s) 106).

In some examples, parameterized bus 104 may be configurable between serial interfacing and parallel interfacing. In some examples, parameterized bus 104 may be configured to be scalable, and may include one or more of a scalable bus width, a scalable client identifier bus, a scalable address bus and a scalable data bus. In some examples, digital controller 102 may be configured to encode transaction commands in a same set of serial bus lines of parameterized bus 104 used to transfer the address and/or register data between digital controller 102 and client(s) 106.

In a non-limiting example, parameterized bus 104 may be configured to operate with one digital controller 102 and one or more client(s) 106. In some examples, a total number of target blocks (client(s) 106) arranged on parameterized bus 104 may be limited by a width of an identity (ID) field of parameterized bus 104. In some examples, a maximum number of target blocks may be determined based on 2^(width of the ID field).

In some examples, the transaction commands (described further below) may include one or more parameters associated with parameterized bus 104 itself. The bus parameters may be used to configure scalable bus conditions (e.g., bus width, identifier bus, address bus and data bus). In some examples, the bus parameters may configure a bus width of bus lines from digital controller 102 to client(s) 106 and/or configure a bus width of bus lines from client(s) 106 to digital controller 102. Table 1 below illustrates example parameters that may be associated with parameterized bus. In some examples, the parameter(s) may include (without being limited to) one or more of a client select line, a client identifier bus width, an address bus logical width, a data bus logical width, an address bus physical width, a write data bus physical width, a read data bus width, a staging buffer type, a final register type, an indication that an address bus and a write bus share physical wires, an indication that a read data bus comprises a daisy chain formation, an indication of a wired OR implementation external to the at least one client and an indication of a masking implementation.

TABLE 1

Example parameters that may be associated with the parameterized bus.

| Parameter Name | Description | Range |
| --- | --- | --- |
| RPP_CS_NUM | Number of client (target block) select lines (or the number of rpp_cs lines). | Valid values: 1~N. Default is 1. |
| RPP_ID_SIZE | Client (target block)_ID bus width. A value of 0 represents only one target block on the bus. | Valid values: 0~M. Default is 4 (or 4-bit wide). |
| RPP_WDBUS_WIDTH | Write data bus (rpp_wd) width. | Valid values: 1~Q. Default is 8 (or 8-bit wide) |
| RPP_RDBUS_WIDTH | Read data bus (rpp_rd) width. | Valid values: 1~T. Default is 1 (or 1 wire) |
| RPP_BUF_LACH_FLOP | Staging buffer physical implementation type. | 0: latch (default) 1: flop. |
| RPP_REG_LATCH_FLOP | Final register physical implementation type. | 0: latch (default) 1: flop. |
| RPP_DAISY_CHAIN | Whether the read data bus (rpp_rd) is a daisy-chain, or a wired-OR outside the target block(s). | 1: daisy chain (default). 0: Wired-OR outside target block(s). |
| RPP_MASK_ENABLE | To enable a bit-select masking feature. The masking feature may be used to support Write-op3, Write-op4 and Clear-op operations. | 1: enable. 0: disable. |

Each client 106 (target block) may include one or more programmable registers 110. Programmable register(s) 110 may be configured to be communicatively coupled to parameterized bus 104. Programmable register(s) 110 (among client(s) 106) may be controlled to perform one or more transactions (e.g., perform read, write and/or clear operation(s)) in accordance with transaction command(s) transferred from digital controller 102 via parameterized bus 104. A transaction command may indicate one or more client(s) 106 as well as one or more specific programmable registers 110 within a specific client 106 to perform the transaction(s). For example, a first transaction command may be specific to an all programmable register(s) 110 within single client (e.g., client 106-1). A second transaction command may be specific to two particular registers 110 within client 106-1. A third transaction command may be specific to particular register(s) 110 within client 106-1 as well as particular register(s) within client 106-M. Accordingly, in some examples, a transaction command may indicate more than one target blocks. In some examples, each client 106 may be assigned with a unique identifier (ID) (e.g., a client ID), where the client ID may be configured to be individually addressable by digital controller 102. In some examples, IC 100 may include one or more memory components (not shown) that may be configured to store the unique client IDs of client(s) 106.

Programmable register(s) 110 may comprise any suitable storage component including (without being limited to) one or more of flop-based components and latch-based components. In some examples, one or more of programmable register(s) 110 may have one or more attributes (discussed further below) including (without being limited to) one or more of a write-clear (w/c) attribute, a read-clear (r/c) attribute, a password-protection attribute, a cycle redundancy check (crc) error (CrCError) attribute.

Client(s) 106 may include any suitable component, including a digital block (e.g., providing one or more mathematical functions) and/or an analog block (e.g., providing one or more analog functions). Non-limiting examples of analog functions that may be provided by an analog block may include one or more of gain functions, comparator functions, switched capacitor functions, filter functions, analog-to-digital conversion functions, digital-to-analog conversion functions, amplifier functions, bandgap reference voltage generation functions, phase-locked loop (PLL) clock trimming functions, analog bias control functions. etc.

Although not shown, IC 100 may include one or more additional components, such as without being limited to, one or more of a CPU, a DSP, random access memory (RAM), read-only memory (ROM), one or more input/output (IO) interfaces for any suitable external components, any other suitable digital and/or analog blocks and the like. In general, IC 100 may be configured with any suitable component(s) for a desired application, and is not limited to any specific application. In general, IC 100 having PRI 112 may be utilized in any application in which one or more inter-block transactions are desired. In a non-limiting example, IC 100 may be utilized with one or more micro-electro-mechanical system (MEMs) sensors.

Referring next to FIG. 2, an example overhead view diagram of IC 100 is shown. In general, IC 100 may include digital controller 102, parameterized bus 104 and client(s) 106 disposed on substrate 200. IC 100 may also include a plurality of signal lines, designated generally as signal lines 202, to electronically connect digital controller 102 and client(s) 106 to parameterized bus 104, for communication therebetween. In general, parameterized bus 104 and signal lines 202 form routing area 204 on substrate 200, between digital controller 102 and client(s) 106. It is understood that FIG. 2 represents a simplified example of IC 100. In general, IC 100 may include one or more additional components (e.g., a CPU, a DSP, memory components, other analog and/or digital components, etc.), one or more digital channels, one or more analog channels, one or more I/O interfaces and the like.

The design of routing area 204 may be a significant factor in a physical layout design phase of IC chip development. It may be appreciated that challenges exist to determine a placement of components as well as an optimal wiring of all components in a tightly constrained area, without introducing significant signal latencies between components. For example, a total number of wires in routing area 204, a physical distance of each client 106 from digital controller 102 on substrate 200 and the size of routing area 204 itself may all impact a time to access programmable register(s) 110 (FIG. 1). In general, as the physical distance between a target block (i.e., client(s) 106) and digital controller 102 increases, an area cost increases for routing interface signals 302 (see FIG. 3) between digital controller 102 and the target block.

PRI 112 of the present disclosure may be configured to encode transaction commands into the same signal lines 202 of parameterized bus 104 used to pass register address and register data from digital controller 102 to one or more client(s) 106, by using a combination of interface signals (forming bus conditions) together with the transaction command(s). In this manner, PRI 112 removes any need for additional side- and signals to facilitate inter-block transactions, and may thus minimize a size of routing area 204.

Referring next to FIG. 3, PRI 112 is further shown, illustrating example interface signals 302 that may be transmitted on signal lines 202 (FIG. 2) between digital controller 102 and client(s) 106 (via parameterized bus 104). Interface signals 302 may include a clock signal (designated as rpp_clk), a write data signal (designated as rpp_wd), a read data signal (designated as rpp_rd) and an event control signal (designated as rpp_cs). Table 2 provides a description of interface signals 302.

TABLE 2

Description of example interface signals.

| Interface Signal | Description |
| --- | --- |
| rpp_clk | The clock signal of the parameterized bus. |
| | Driven by the digital controller. |
| rpp_wd | Data from the digital controller to all target blocks (client(s)). |
| | Driven by the digital controller. |
| | The bus width of rpp_wd may be parameterized. |
| | A wider bus may be used if programming time is limited (e.g., depending on a desired register access latency cost). |
| rpp_rd | Data from all target block(s) (client(s) back to the digital controller. |
| | The bus width of rpp_rd may be parameterized. |
| | The 1-bit option may be used if a read-turn-around time is not constrained (e.g., depending on a desired register accessing design constraint). |

TABLE 2-continued

Description of example interface signals.

| Interface Signal | Description |
| --- | --- |
| rpp_cs | For RESET, START and STOP event generation.<br>Driven by the digital controller.<br>The bus width of rpp_cs may be parameterized.<br>For a serial interface scheme, the number of rpp_cs lines may be set to 1.<br>For a parallel interface scheme, the number of rpp_cs lines may be the same as a number of target blocks (client(s)) connected to the parameterized bus. |

As best shown in FIG. 3, signal lines 202 (FIG. 2) include a first set of parameterized bus lines from digital controller 102 to client(s) 106 (e.g., carrying interface signals rpp_cs, rpp_clk and rpp_wd) and a second set of parameterized bus lines from client(s) 106 to digital controller 102 (e.g., carrying interface signal(s) rpp_rd). In some examples, the read data signal (rpp_rd) may be transmitted on signal line(s) 306 (directly) between client(s) 106 and digital controller 102. In some examples, the read data signal may be transmitted on optional signal line(s) 308, serially from one client 106 to another until reaching first client 106-1 (after which first client 106-1 may transfer the read signal on signal line 306). For example, for M=3 clients 106, client 106-3 may transfer a read data signal to client 106-2 on signal line 308. Next, client 106-2 may transfer the read data signal to client 106-1 on signal line 308. Finally, client 106-1 may transfer the read data signal to parameterized bus 104 on signal line 306, which read data signal may then be transferred to digital controller 102.

In some examples, client(s) 106 may be configured to communicate with one or more optional analog IP elements, designated generally as 306. In some examples, one target block may be used with one analog IP 304. For example, client 106-1 may be in communication with one analog IP 304-1. In some examples, one target block may be in communication with more than one analog IP (e.g., an N number of analog IP components, where N is an integer greater than or equal to 2). For example, client 106-M may be in communication with analog IP 304-M,1, . . . , analog IP 304-M,N. Analog IP 304 may include any suitable analog IP element such as, without being limited to an analog to digital convertor (ADC), a digital to analog convertor (DAC), a power supply, a power on reset element, a low-dropout regulator, a glitch detector, an oscillator, a phased lock loop (PLL), a low-noise amplifier and the like.

As discussed further below with respect to FIG. 4, interface signals 302 may be combined (by digital controller 102) to form one or more bus conditions. Digital controller 102 may be configured to arrange the bus condition(s) and at least one transaction command in a predetermined sequence and transfer the sequence to one or more designated clients among client(s) 106 via parameterized bus 104. The designated client(s) 106 may then perform the transaction(s) (e.g., a read operation, a write operation, a read-only operation, a write-clear operation, a read-clear operation, a password protection operation and/or an error-protection operation) in accordance with the transaction command(s) in the transferred sequence.

Figure 4:
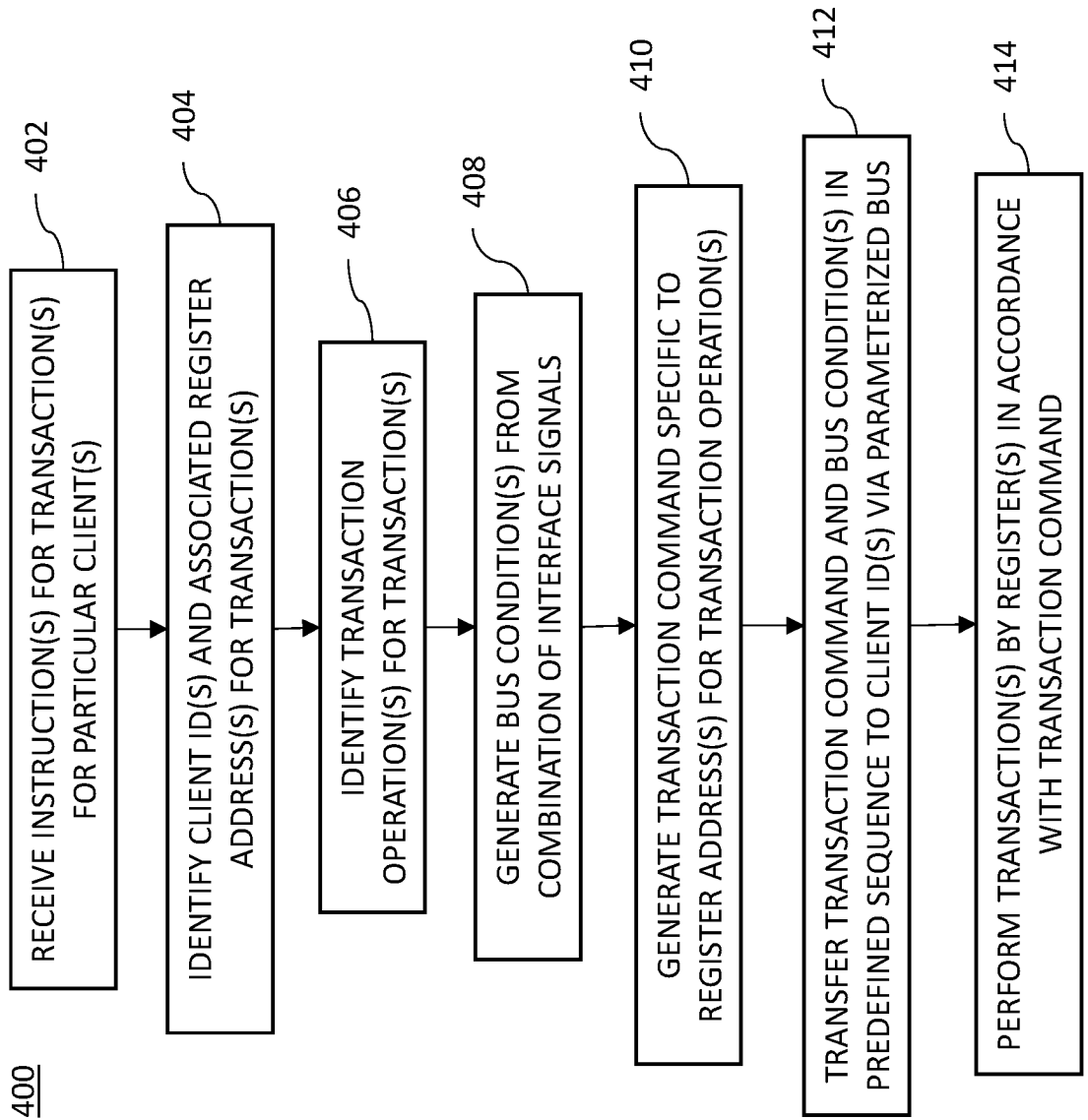
FIG. 4 is a flowchart diagram of an example method of register programming, according to an aspect of the present disclosure.

Referring next to FIG. 4, a flowchart diagram is shown of example method 400 for register programming, according to an aspect of the present disclosure. Method 400 is described with respect to FIGS. 1-3 and 5A-7B. It is understood that the steps described herein represent an example embodiment, that the order of the steps may vary, and that some steps may be performed at to same time or in any suitable sequence.

At step 402, digital controller 102 may receive one or more instructions for one or more transactions associated with one or more particular client(s) 106. The instruction(s) may be received, for example, from another component of IC 100 (e.g., a DSP, a CPU, etc.). In some examples, digital controller 102 itself may generate the instruction(s). At step 404, digital controller 102 may identify the client ID(s) associated with the particular client(s) 106 in the instruction(s), as well as one or more register addresses of programmable register(s) 110 associated with the client ID(s) in the instruction(s). At step 406, digital controller 102 may identify one or more operations associated with the particular transaction(s) (in the instruction(s) of step 402) to be performed by the particular register address(es) (identified at step 404).

At step 408, digital controller 102 may generate one or more bus conditions from a combination of interface signals, based on the transaction(s) indicated in the instruction(s) (step 402). The bus condition(s) may be generated, by digital controller 102, from a predetermined combination of interface signals 302. The bus condition(s) may include (without being limited to) one or more of a reset condition, an idle condition, a start transaction condition, a stop transaction condition and an active condition. Table 3 below provides a description of example bus conditions used (in the transferred sequence of bus conditions and transaction command) to initiate transaction(s) by programmable register(s) 110.

TABLE 3

Description of example bus conditions.

| Bus Condition | Interface Signal Conditions | Description |
| --- | --- | --- |
| RESET | rpp_cs = 0<br>rpp_clk = 0<br>rpp_wd = 0 | The "RESET" bus condition is to reset all target blocks (client(s)), including any finite state machines (FSM) and all programmable registers inside each target block. |

TABLE 3-continued

Description of example bus conditions.

| Bus Condition | Interface Signal Conditions | Description |
| --- | --- | --- |
| IDLE | rpp_cs = 0<br>rpp_clk = 0<br>rpp_wd ! = 0 | The "IDLE" bus condition is to indicate no register transactions are being performed. When in the "IDLE" bus condition, all target blocks may drive the rpp_rd bus with a value of 0. |
| START | rpp_cs 0 → 1<br>rpp_clk = 0<br>rpp_wd = 1's (all bits = 1) | The "START" bus condition is the beginning (i.e., start) of a transaction. |
| STOP | rpp_cs 1 → 0<br>rpp_clk = 0<br>rpp_wd = 1's (all bits = 1) | The "STOP" bus condition is to terminate a transaction. After the "STOP" bus condition, the finite state machine of a selected target block may return back to an idle state. |
| ACTIVE | rpp_cs = 1<br>rpp_clk = X (don't care)<br>rpp_wd = X (don't care) | The "ACTIVE" bus condition is the time between the "START" bus condition and the "STOP" bus condition. This bus condition means that a transaction is ongoing. |

Figure 9:
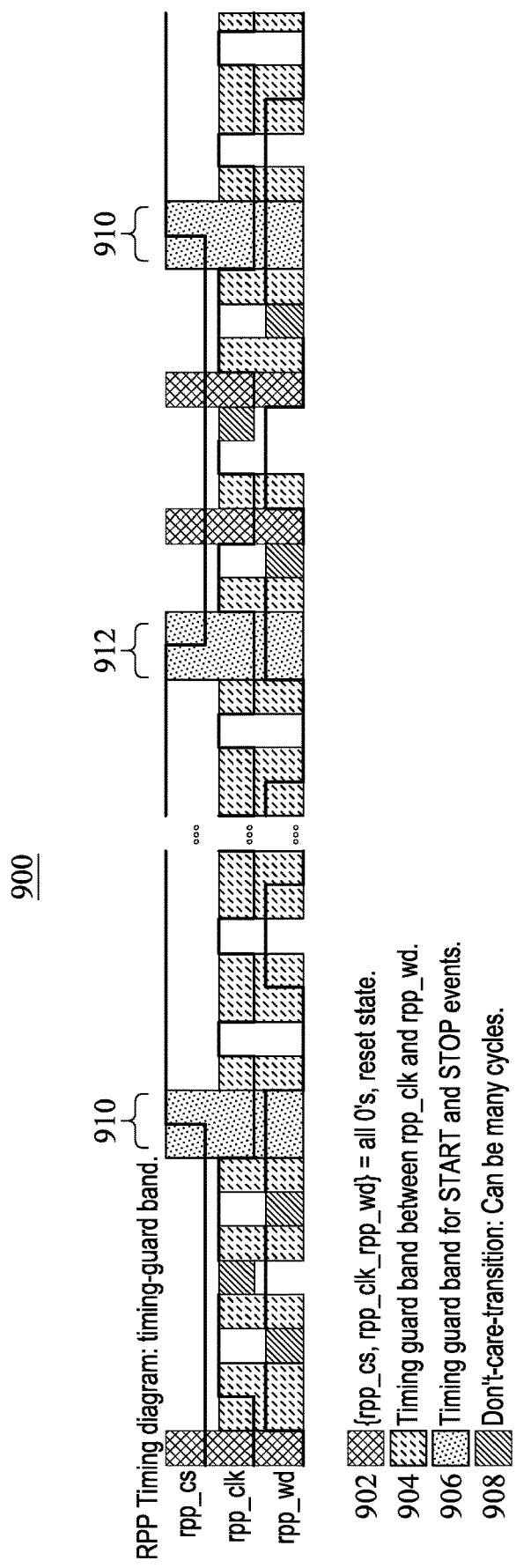
FIG. 9 is a timing diagram illustrating a timing of various interface signals of the parameterized register interface shown in FIG. 3, according to an aspect of the present disclosure.

Referring to FIGS. 5A and 5B, example timing diagrams example bus conditions are shown. For example, FIG. 5A illustrates a start transaction (e.g., a start-event) bus condition. As shown in FIG. 5A, to indicate a start transaction bus condition, interface signals 302 are combined such that: the event control signal (rpp_cs) is changed from 0 to 1, the clock signal (rpp_clk) is set to 0 and the write data signal (rpp_wd) is set to 1. FIG. 5B illustrating a stop transaction (e.g., a stop-event) bus condition. As shown in FIG. 5B, to indicate a stop transaction bus signal, interface signals 302 are combined such that: the event control signal (rpp_cs) is changed from 1 to 0, the clock signal (rpp_clk) is set to 0 and the write data signal (rpp_wd) is set to 1. FIGS. 9-10D provide additional examples of timing diagrams illustrating bus conditions used as part of the sequence of bus conditions and bus condition(s) to cause programmable register(s) 110 to perform transaction operation(s).

Referring back to FIG. 4, at step 410, digital controller 102 may generate at least one transaction command specific to the register address(s) among programmable register(s) 110 (of the particular client ID(s)) indicated in the instruction(s). As will be discussed further below, a transaction command may be generated according to a predetermined RPP.

At step 412, digital controller 102 may transfer the transaction command(s) (generated at step 410) and the bus condition(s) (generated at step 408) in a predefined sequence to the particular client IDs among client(s) 106, via parameterized bus 104. At step 414, programmable register(s) 110 for the particular client(s) 106 may perform the transaction(s) (the transaction operations) in accordance with the transaction command in the transferred predefined sequence. In general, the predefined sequence may have a particular sequential order that includes a series of bus conditions (e.g., an idle bus condition, a start transaction bus condition), the transaction command, and a further series of bus conditions (e.g., a stop transaction bus condition and an idle bus condition). In some examples, the predefined sequence may also include an active bus condition that may be transferred concurrent with the transaction command (see FIGS. 10A-10D) via parameterized bus 104.

Referring to FIG. 6, an example chart illustrating various RPP sequences associated with different transaction operations is shown. In FIG. 6, examples are provided for various write operations (e.g., write-op1, write-op2, write-op3 and write-op4 operations), for various read operations (e.g., read-op1 and read-op2 operations), a clear operation (e.g., clear-op operation) and a command operation (e.g., cmd-op operation). In some examples, the most significant (MS) bit(s) of all components in the transaction (e.g., the CMD portion and the data (e.g., payload)) may be sent on parameterized bus 104 first.

As shown in FIG. 6, the transaction command portion of the predetermined sequence may include a predetermined sequence of a transaction mode component (e.g., "CMD"), a client ID component (e.g., 'ID"), at least one register address component (e.g., "ADDR"), and at least one data operation component (e.g., "wDATA", "rDATA"). In general, the data operation component may indicate a read operation and/or a write operation to be performed by associated register address. In some examples, the transaction command may further include a mask component (e.g., "Mask"). In some examples, the transaction command may further include a status bit (as part of the transaction mode component "CMD") indicative of a corruption status of non-volatile memory data. The predefined RPP of the present disclosure is defined as including the bus conditions, the components of the transaction command as well as the predetermined sequence of bus conditions and transaction command transferred on parameterized bus 104 used to cause programmable register(s) 110 to perform transaction operation(s). Table 4 below provides a description of the various components of a transaction command.

TABLE 4

Description of various components of a transaction command.

| Transaction Command component | Description |
|---|---|
| ID | The unique ID to select a target block (client). The bus width of client ID may configurable. |
| ADDR | The address points to a programmable register residing in the selected target block (client). The bus width of ADDR may be configurable. |
| Mask | An optional field.<br>This component may be used to select bits of a byte to be accessed in write-op3, write-op4 or clear-op2 operations. |
| wDATA | In a write transaction, the data from the digital controller to the target blocks (client). The width may be configurable. |
| rDATA | In a read transaction, the data from a target block (client) back to the digital controller. The width may be configurable.<br>In some examples, the selected target block (client) may drive a non-zero value to the rpp_rd signal.<br>Option 1: the rpp_rd signal line may be daisy chained from one target block to another target block. Each target block may have an input port for an rpp_rd signal line input and an output port for an rpp_rd signal line output.<br>Option 2: A wired-OR may be implemented outside the target blocks. In option 2, each target block (client) may only include an output port for an rpp_rd signal line. |
| CMD[3:0] | [3:1], The type of transaction.<br>This type of transaction is applicable to the selected target of a current transaction.<br>000: write-op1. A write transaction from the digital controller to the selected target block.<br>010: write-op2. A write transaction from the digital controller to the selected target block.<br>001: write-op3. A write transaction from the digital controller to the selected target block.<br>011: write-op4. A write transaction from the digital controller to the selected RPP target block.<br>100: read-op1. A read transaction from the digital controller to the selected target block.<br>101: read-op2. A read transaction from the digital controller to the selected target block.<br>110: clear-op. A clear-the-contents transaction from the digital controller to the selected target block.<br>111: Reserved<br>[0], The CrcErrorFlag status.<br>This status may be broadcast information applicable to all target blocks on the parameterized bus.<br>1: Indicates data in the non-volatile memory is corrupt due to CRC signature mismatching.<br>0: Indicates data in the non-volatile memory is not corrupt. |

Figure 7A:
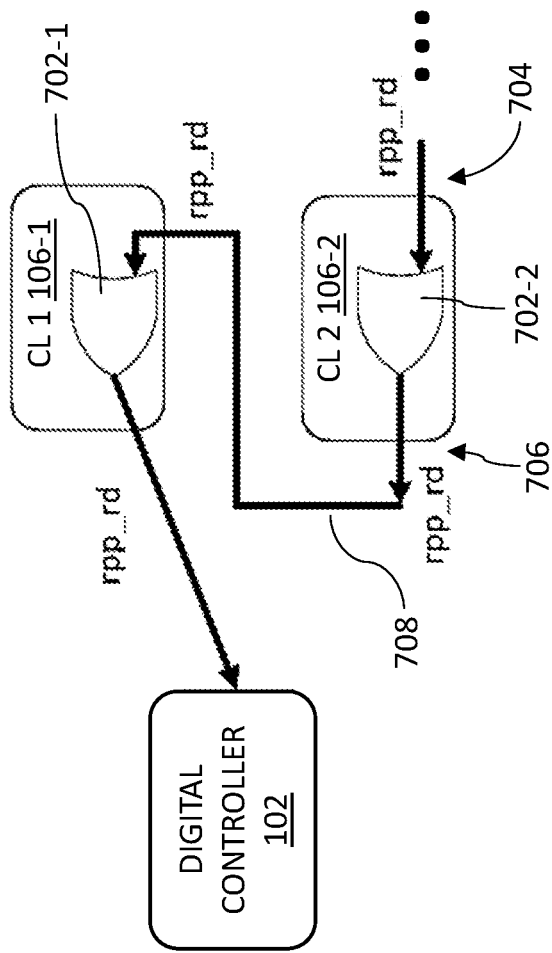
FIGS. 7A and 7B are example circuit diagrams illustrating respective daisy chain and wired-OR configurations of a read data bus, according to an aspect of the present disclosure.
Figure 7B:
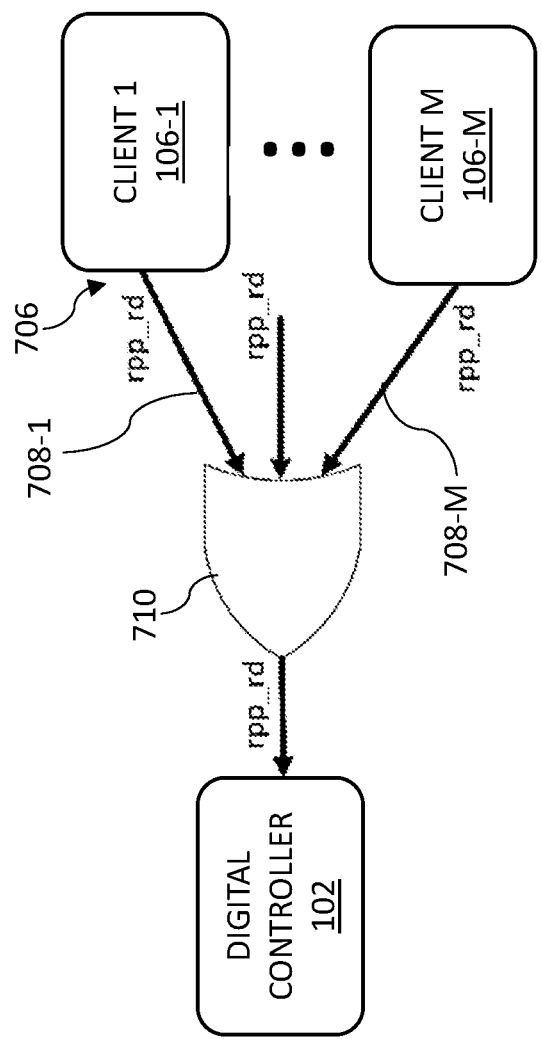

As noted in Table 4, there may be two options for connecting the read data lines of client(s) 106 (the read data bus) for transferring the read data interface signal(s) (i.e., the rpp_rd signal(s)) from client(s) 106 to digital controller 102. FIGS. 7A and 7B are example circuit diagrams illustrating the daisy chain and wired-OR configurations of the read data bus.

FIG. 7A illustrates the daisy chain configuration (option 1). In FIG. 7A, each of clients (CL) 106 (e.g., first client 106-1 (CL 1) and second client 106-2 (CL 2)) includes OR gate 702, input port 704 and output port 706. Read data bus 708 is connected between output port 706 of one client (e.g., second client 106-2) and input port 704 of a next client (e.g., first client 106-1). In this manner, the read data bus 708 may be daisy chained from one target block (e.g., second client 106-2) to another target block (first client 106-1). In this example, the read data signal (rpp_rd) is received at input port 704 of second client 106-2 (from a further client) via read data bus 708. The received data signal (and any read data of second client 106-2 are applied to OR gate 702-2. The resultant read data signal is output from output port 706 of second client 106-2 and transferred to input port 704 of first client 106-1 via read data bus 708. A similar operation is performed by first client 106-1 (via OR gate 702-1) on the read data signal received from second client 106-2. The resultant read data signal from output port 706 of first client 106-1 is then transferred to digital controller 102.

FIG. 7B illustrates the wired-OR configuration (option 2). In FIG. 7B, the configuration includes wired OR gate 710 between digital controller 102 and client(s) 106 (e.g., client 106-1, . . . , client 106-M). In this configuration, OR gate 710 may be implemented outside the target blocks (client(s) 106). In option 2, each target block (client 106) may include output port 706 transmitting a read data signal (rpp_rd) on a respective read signal line of read data bus 708 (e.g., signal lines 708-1, . . . , 708-M). In contrast to the daisy chain configuration, client(s) 106 may not include an input port for receiving a read data signal (rpp_rd). Each client 106 may transfer a read data signal (rpp_rd) over their respective read signal lines (e.g., signal lines 708-1, . . . , 708-M) of read data bus 708 to OR gate 710. A resultant signal from OR gate 710 may then be transferred to digital controller 102.

Next, programming of programmable registers 110 having various attributes are described.

Registers with W/C Attribute

A register bit with a write-clear (W/C) attribute means that if the register bit is programmed with a value of 1, then the value of 1 should be cleared back to a value of 0 at one clock cycle later. This is also called a write-1-self-clear operation.

A write-1-self-clear operation from digital controller 102 to a target block (e.g., client 106-1) is achieved by issuing a pulse output from the target block (e.g., client 106-1) when a W/C register bit is programmed with a value of 1.

Reasons why issuing a pulse may be sufficient for executing the write-1-self-clear operation is as follows. A register bit with the W/C attribute doesn't mean a programmable register 110 is physically needed. When digital controller 102 writes a value of 1 to a W/C register bit residing in the target block (e.g., client 106-1), the target block (e.g., client 106-1) may use combinational logic to generate a pulse. The combinational logic to generate the pulse may not create a glitch on the edge of the pulse.

Registers with R/C Attribute

The read-clear (R/C) operation is to clear a read-only status register to a value of 0 after the contents of the read-only status register have been read. For the following reasons, digital controller 102 may be responsible for carrying out the read-clear operation. A first reason includes, in order to save the routing area from a target block (e.g., client 106-1) to clear the register contents to 0. A second reason is that no clock may be available to the target block (e.g., client 106-1) to perform the above clear operation.

A read-clear operation to a programmable register 110 residing in a target block (e.g., client 106-1) may be achieved by the following two transactions. A first read operation may be performed from digital controller 102 to the selected programmable register 110 residing in the target block (e.g., client 106-1). Next, a follow-up clear operation may be performed from digital controller 102 to the selected programmable register 110 residing in the target block (e.g., client 106-1).

Registers with a Password Protection Attribute

The password protection attribute may be used to shield programmable registers 110 from being accessed when an internal password is not unlocked. In order to save the area of the target block (e.g., client 106-1) from needing to include additional elements for executing the password protection operation, digital controller 102 may be responsible for carrying out the password protection operation.

For a write operation, digital controller 102 may skip a write transaction to a password protected register when the password is not unlocked. For a read operation, digital controller 102 may skip a read transaction to a password protected register when the password is not unlocked. Digital controller 102 may provide 0 as the read-return value for the read operation.

Registers with a CrcError Attribute

Figure 8:
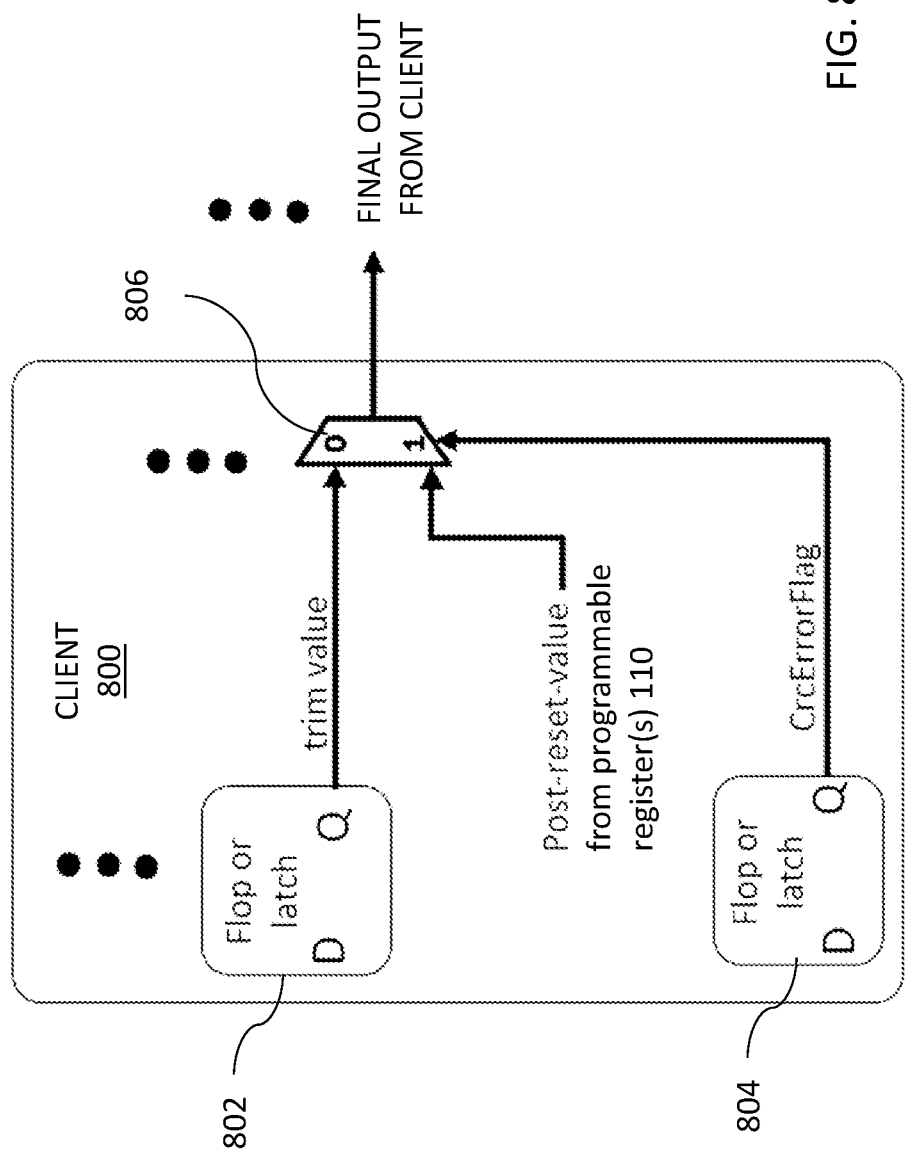
FIG. 8 is a circuit diagram of an example client having one or more programmable registers with an error protection implementation, according to an aspect of the present disclosure.

An intent of the CrcError protection operation is to prevent permanent damage to the chip due to corrupt data from a non-volatile memory. CrcError protection is described with respect to FIG. 8. FIG. 8 illustrates a circuit diagram of example client 800 having one or more programmable registers 110 with an error protection attribute. The error implementation of client 800 may include non-volatile memory 802, local storage component 804 and data selector 806 (e.g., a multiplexer). Data selector 806 may select one of memory contents (e.g., a trim value) from non-volatile memory 802 and an output value (e.g., a post-reset-value) from programmable register(s) 110, depending on a value of the CrcError flag that may be stored in local storage component 804. In some examples, each of non-volatile memory 802 and local storage component 804 may be implemented with a flop-based type storage component and/or a latch-based type storage component.

In some examples, the CrcErrorFlag status bit may be set to 1 to indicate if data corruption occurs when fetching data from non-volatile memory 802. When the CrcErrorFlag=1, the power-on-default contents (e.g., a post-reset-value) of programmable register(s) 110 having the CrcError protection attribute may be selected (by data selector 806) as the final output from client 800 (e.g., a target block). When the CrcErrorFlag=0, the contents from the non-volatile memory for programmable register 110 may be selected (by data selector 806) as the final output from client 800 (e.g., a target block).

In some examples, the CrcError function may be implemented in the target block (e.g., client 800). An additional area cost may be low as, typically, few selected trimmable registers may include CrcError protection. In operation, the CrcErrorFlag status may comprise broadcast information applicable to all target blocks (e.g., client(s) 106) on parameterized bus 104. In some examples, digital controller 102 may broadcast the CrcErrorFlag in each transaction. Every target block (e.g., client 800) may receive the CrcErrorFlag status input and may retain the information in its local storage. Any target blocks such as client 800 having programmable register(s) 110 that include an CrcError protection attribute may utilize the broadcasted information as described above.

RPP Target, Staging Buffers and Final Registers

In some examples, final registers inside a client 106 (e.g., a target block) may be implemented with latch-type or flop-type components. In some examples, any staging buffers (not shown) for serial-to-parallel operation inside a client 106 may be implemented with flop-type or latch-type components. In some examples, a latch-based implementation (e.g., for any final registers and/or staging buffers) may incur additional register access time, as additional clock cycles may be used to ensure a hold/setup time for latches. In some examples, a trade-off for selecting either latches or flops as an implementation choice (e.g., for any final registers and/or staging buffers) may be based on an area cost and a register accessing time.

A/C Timing

In some examples, a setup and hold time among interface signals 302 may be ensured by design, and may not depend on physical routing delays. In some examples, at any one time, only one interface signal 302 on parameterized bus 104 may be configured to toggle. Two togglings among interface signals 302 may be separated by a time gap. The time gap is referred to herein as a timing guard-band. At least one clock signal from clock circuit 108 (FIG. 1) of digital controller 102 may be configured to drive all signals (e.g., interface signals 302 forming bus condition(s), transaction commands, other signals) sent from digital controller 102. The minimum timing guard-band may comprise one clock cycle (of the clock signal(s) from clock circuit 108).

Referring to FIG. 9, example timing diagram 900 of interface signals 302 (including rpp_cs, rpp_clk and rpp_wd) is shown. Timing diagram 900 illustrates the timing guard-bands among rpp_cs (event control signal), rpp_clk (clock signal) and rpp_wd (write data signal) (among interface signals 302). More particularly, timing diagram 900 illustrates examples of reset state 902, timing guard band 904 (between rpp_clk and rpp_wd signals), timing guard band 906 (for start and stop events) and don't-care-transition 908 (which can be one or more cycles). Timing diagram 900 also illustrates start event 910 (a start transaction bus condition) and stop event 912 (a stop transaction bus condition).

Transaction Command Timing Examples

Figure 10A:
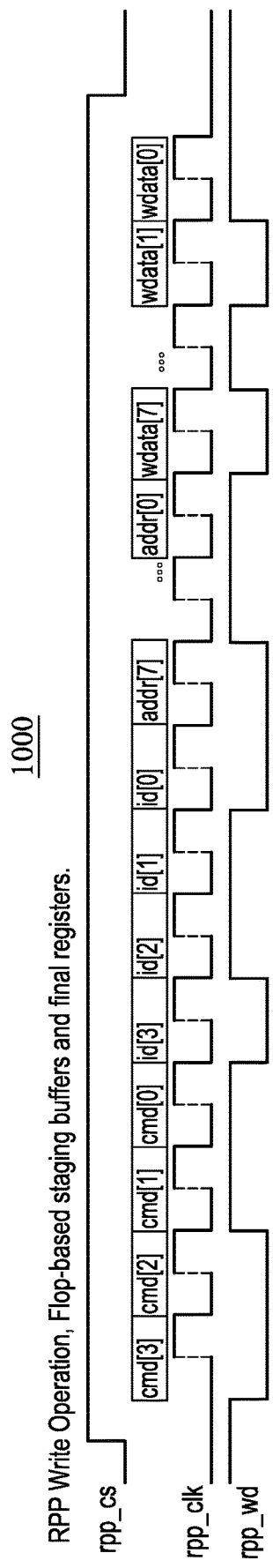
FIGS. 10A and 10B are timing diagrams illustrating example write and read operations, respectively, for programming flop-based registers, according to an aspect of the present disclosure.
Figure 10B:
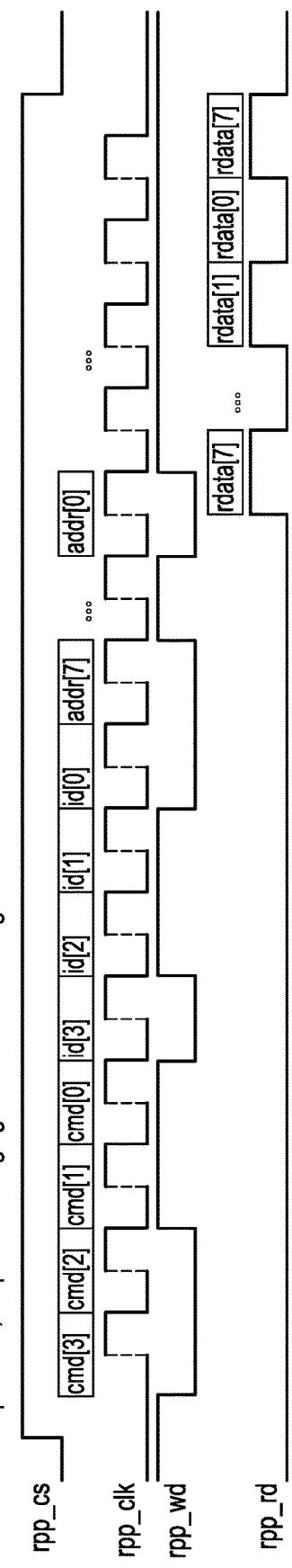
Figure 10C:
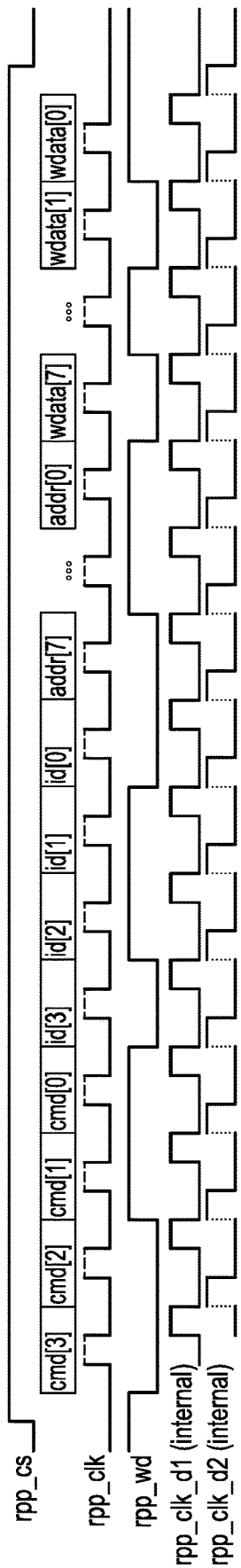
FIGS. 10C and 10D are timing diagrams illustrating example write and read operations, respectively, for programming latch-based registers, according to an aspect of the present disclosure.
Figure 10D:
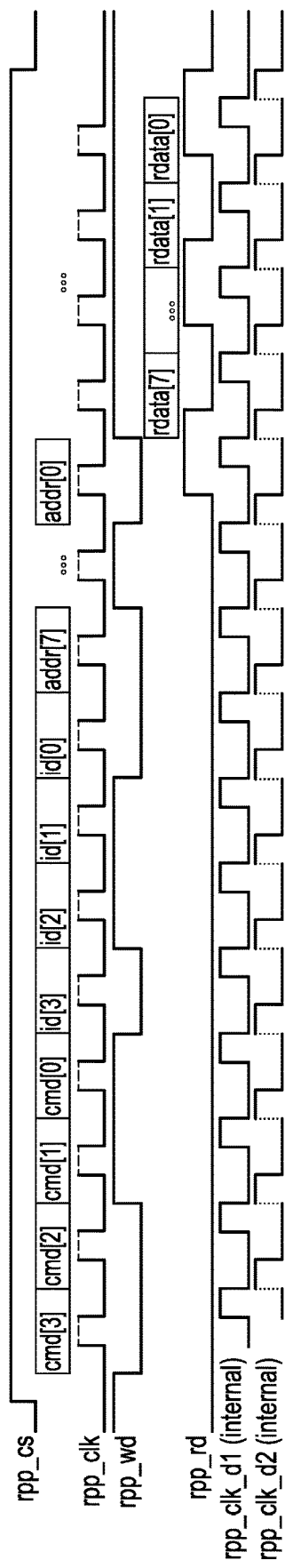

Referring next to FIGS. 10A-10D, example timing diagrams 1000-1006 are shown that illustrate various read and write transaction operations in accordance with the RPP bus condition and transaction command sequences described herein. In particular, FIG. 10A illustrates timing diagram 1000 for an example write operation for programming flop-based staging buffers and final registers; FIG. 10B illustrates timing diagram 1002 for an example read operation for programming flop-based staging buffers and final registers; FIG. 10C illustrates timing diagram 1004 for an example write operation for programming latch-based staging buffers and final registers; and FIG. 10D illustrates timing diagram 1006 for an example read operation for programming latch-based staging buffers and registers. FIGS. 10A-10D also indicate the active bus condition that may be concurrent with the transaction command.

Referring to FIGS. 10A and 10B, the respective example write and read transaction operations (including example transaction commands) assume the staging buffers and final registers in the target block(s) are implemented with flops. The dashed line indicates that the target block operates on the rising edge of the rpp_clk signal. Digital controller 102 may be configured to interface with the target block(s) (e.g., client(s) 106) at the falling edge of the rpp_clk signal.

Referring to FIGS. 10C and 10D, the respective example write and read transactions (including example transaction commands) assumes the staging buffers and final registers in the target block(s) are implemented with latches. For reference, the rpp_clk_d1 and rpp_clk_d2 are internal signals of the target blocks. The dashed line indicates latches in the target blocks are enabled for accepting inputs. The dotted line indicates the clocking edge of the internal FSM of the target block.

While the present disclosure has been discussed in terms of certain embodiments, it should be qualified that the present disclosure is not so limited. The embodiments are explained herein by way of example, but there are numerous modifications, variations and other embodiments that may be employed that would still be within the scope of the present disclosure.

What is claimed:

1. An integrated circuit comprising:
   a digital controller;
   at least one client comprising at least one programmable register; and
   a parameterized bus coupled to the digital controller and the at least one client,
   the digital controller configured to:
   transfer, via the parameterized bus, at least one of address data and register data between the digital controller and the at least one client according to one or more interface signals conveyed over the parameterized bus,
   generate a transaction command comprising at least one transaction specific to the at least one programmable register of the at least one client, the transaction command generated according to a predetermined register programming protocol (RPP), and
   transfer, via the parameterized bus, the transaction command together with at least one predetermined combination of the one or more interface signals to the at least one client, the at least one programmable register configured to perform the at least one transaction in accordance with the transaction command.

2. The integrated circuit of claim 1, wherein the at least one transaction comprises at least one of a read operation, a write operation, a read-only operation, a write-clear operation, a read-clear operation, a password protection operation and an error-protection operation.

3. The integrated circuit of claim 1, wherein the digital controller is configured to operate with one or more addressing modes including at least one of burst access with an address auto-increment mode and burst access with a non-consecutive address mode.

4. The integrated circuit of claim 1, wherein the one or more interface signals comprise at least one of a clock signal, a write data signal, a read data signal and an event control signal.

5. The integrated circuit of claim 1, wherein the at least one predetermined combination of the one or more interface signals forms one or more bus conditions, the one or more bus conditions comprising one or more of a reset condition, an idle condition, a start transaction condition, a stop transaction condition and an active condition.

6. The integrated circuit of claim 5, wherein the digital controller is configured to transfer the transaction command such that at least one of the one or more bus conditions and the transaction command are arranged in a predetermined sequence.

7. The integrated circuit of claim 6, wherein the predetermined sequence comprises a sequential order of the idle condition, the start transaction condition, the transaction command, the stop transaction condition and the idle condition.

8. The integrated circuit of claim 1, wherein the transaction command comprises a transaction mode component, a client identifier component, at least one register address component, and at least one data operation component, the at least one data operation component indicative of at least one of a read operation and a write operation.

9. The integrated circuit of claim 8, wherein the transaction command further comprises one or more of a mask component and a status bit indicative of a corruption status of non-volatile memory data.

10. The integrated circuit of claim 1, wherein the parameterized bus is associated with one or more parameters, the one or more parameters comprising one or more of a client select line, a client identifier bus width, an address bus logical width, a data bus logical width, an address bus physical width, a write data bus physical width, a read data bus width, a staging buffer type, a final register type, an indication that an address bus and a write bus share physical wires, an indication that a read data bus comprises a daisy chain formation, an indication of a wired OR implementation external to the at least one client and an indication of a masking implementation.

11. The integrated circuit of claim 1, wherein the digital controller is configured to encode the transaction command in a same set of serial bus lines of the parameterized bus used to transfer the at least one of the address data and the register data between the digital controller and the at least one client.

12. The integrated circuit of claim 1, wherein the parameterized bus is configurable between serial interfacing and parallel interfacing.

13. The integrated circuit of claim 1, wherein the parameterized bus is configured to comprise one or more of a scalable bus width, a scalable client identifier bus, a scalable address bus and a scalable data bus.

14. The integrated circuit of claim 1, wherein the at least one programmable register comprises at least one of a flop-based storage component and a latch-based storage component.

15. The integrated circuit of claim 1, wherein the parameterized bus comprises a first set of parameterized bus lines from the digital controller to the at least one client and a second set of parameterized bus lines from the at least one client to the digital controller.

16. A method of operation of an integrated circuit, the method comprising:
transferring, by a digital controller, via a parameterized bus coupled to the digital controller and at least one client, at least one of address data and register data between the digital controller and the at least one client according to one or more interface signals conveyed over the parameterized bus, the at least one client comprising at least one programmable register;
generating, by the digital controller, a transaction command comprising at least one transaction specific to the at least one programmable register of the at least one client, the transaction command generated according to a predetermined register programming protocol (RPP);
transferring, by the digital controller, via the parameterized bus, the transaction command together with at least one predetermined combination of the one or more interface signals to the at least one client; and
performing, by the at least one programmable register, the at least one transaction in accordance with the transaction command.

17. The method of claim 16, wherein the at least one transaction comprises at least one of a read operation, a write operation, a read-only operation, a write-clear operation, a read-clear operation, a password protection operation and an error-protection operation.

18. The method of claim 16, wherein the method further comprises transferring one or more of the at least one of the address data, the register data and the transaction command in accordance with one or more addressing modes including at least one of burst access with an address auto-increment mode and burst access with a non-consecutive address mode.

19. The method of claim 16, wherein the one or more interface signals comprise at least one of a clock signal, a write data signal, a read data signal and an event control signal.

20. The method of claim 16, wherein the at least one predetermined combination of the one or more interface signals forms one or more bus conditions, the one or more bus conditions comprising one or more of a reset condition, an idle condition, a start transaction condition, a stop transaction condition and an active condition.

21. The method of claim 20, wherein the transferring of the transaction command further comprises transferring the transaction command together with the at least one predetermined combination of the one or more interface signals such that at least one of the one or more bus conditions and the transaction command are arranged in a predetermined sequence.

22. The method of claim 21, wherein the predetermined sequence comprises a sequential order of the idle condition, the start transaction condition, the transaction command, the stop transaction condition and the idle condition.

23. The method of claim 16, wherein the transaction command comprises a transaction mode component, a client identifier component, at least one register address component, and at least one data operation component, the at least one data operation component indicative of at least one of a read operation and a write operation.

24. The method of claim 23, wherein the transaction command further comprises one or more of a mask component and a status bit indicative of a corruption status of non-volatile memory data.

25. The method of claim 16, wherein the parameterized bus is associated with one or more parameters, the one or more parameters comprising one or more of a client select line, a client identifier bus width, an address bus logical width, a data bus logical width, an address bus physical width, a write data bus physical width, a read data bus width, a staging buffer type, a final register type, an indication that an address bus and a write bus share physical wires, an indication that a read data bus comprises a daisy chain formation, an indication of a wired OR implementation external to the at least one client and an indication of a masking implementation.

26. The method of claim 16, the method further comprising encoding, by the digital controller, the transaction command in a same set of serial bus lines of the parameterized bus used to transfer the at least one of the address data and the register data between the digital controller and the at least one client.

27. The method of claim 16, the method further comprising configuring the parameterized bus between serial interfacing and parallel interfacing.

28. The method of claim 16, the method further comprising scaling, by the parameterized bus, one or more of a bus width, a client identifier bus, an address bus and a data bus.

* * * * *